US009123392B1

(12) United States Patent
Yan et al.

(10) Patent No.: US 9,123,392 B1
(45) Date of Patent: Sep. 1, 2015

(54) NON-VOLATILE 3D MEMORY WITH CELL-SELECTABLE WORD LINE DECODING

(71) Applicant: SanDisk 3D LLC, Milpitas, CA (US)

(72) Inventors: Tianhong Yan, San Jose, CA (US); Roy Edwin Scheuerlein, Cupertino, CA (US)

(73) Assignee: SANDISK 3D LLC, Milpitas, CA (US)

( * ) Notice: Subject to any disclaimer, the term of this patent is extended or adjusted under 35 U.S.C. 154(b) by 0 days.

(21) Appl. No.: 14/229,482

(22) Filed: Mar. 28, 2014

(51) Int. Cl.
G11C 11/00 (2006.01)
G11C 5/02 (2006.01)
G11C 13/00 (2006.01)

(52) U.S. Cl.
CPC .............. *G11C 5/02* (2013.01); *G11C 13/0021* (2013.01)

(58) Field of Classification Search
USPC .................................................. 365/51, 148
See application file for complete search history.

(56) References Cited

U.S. PATENT DOCUMENTS

| 5,172,338 | A  | 12/1992 | Mehrotra et al. |
|---|---|---|---|
| 5,570,315 | A  | 10/1996 | Tanaka et al. |
| 5,774,397 | A  | 6/1998  | Endoh et al. |
| 6,046,935 | A  | 4/2000  | Takeuchi et al. |
| 6,222,762 | B1 | 4/2001  | Guterman et al. |
| 6,373,746 | B1 | 4/2002  | Takeuchi et al. |
| 6,456,528 | B1 | 9/2002  | Chen |
| 6,522,580 | B2 | 2/2003  | Chen et al. |
| 6,538,922 | B1 | 3/2003  | Khalid et al. |
| 6,643,188 | B2 | 11/2003 | Tanaka et al. |
| 6,678,192 | B2 | 1/2004  | Gongwer et al. |
| 6,771,536 | B2 | 8/2004  | Li et al. |
| 6,781,877 | B2 | 8/2004  | Cernea et al. |
| 7,023,739 | B2 | 4/2006  | Chen et al. |
| 7,177,191 | B2 | 2/2007  | Fasoli et al. |
| 7,237,074 | B2 | 6/2007  | Guterman et al. |
| 7,324,393 | B2 | 1/2008  | Chan et al. |
| 7,342,279 | B2 | 3/2008  | Harari et al. |
| 8,547,720 | B2 | 10/2013 | Samachisa et al. |
| 2006/0184720 | A1 | 8/2006  | Sinclair et al. |
| 2009/0001344 | A1 | 1/2009  | Schricker et al. |
| 2009/0122598 | A1 | 5/2009  | Toda et al. |
| 2010/0259961 | A1 * | 10/2010 | Fasoli et al. ..................... 365/51 |
| 2010/0289084 | A1 | 11/2010 | Yoon et al. |

* cited by examiner

*Primary Examiner* — Hoai V Ho
(74) *Attorney, Agent, or Firm* — Davis Wright Tremaine LLP

(57) ABSTRACT

A three-dimensional array of memory elements is formed across multiple layers of planes positioned at different distances above a semiconductor substrate. The memory elements are each accessible by a word line in a plane and a local bit line. The three-dimensional array includes a two-dimensional array of pillar lines through the multiple layers of planes. The pillar lines are of a first type that act as local bit lines and a second type that provide access to the word lines by having respective memory elements preset to a permanently low resistance state for connecting second-type pillar lines for exclusive access to respective word lines. An array of metal lines on the substrate is switchably connected to the vertical bit lines to provide access to the local bit lines and the word lines.

20 Claims, 15 Drawing Sheets

NON-VOLATILE 3D MEMORY WITH CELL-SELECTABLE WORD LINE DECODING

BACKGROUND

The subject matter of this application is the structure, use and making of re-programmable non-volatile memory cell arrays, and, more specifically, to efficient access of word lines in three-dimensional arrays of memory storage elements formed on semiconductor substrates.

Uses of re-programmable non-volatile mass data storage systems utilizing flash memory are widespread for storing data of computer files, camera pictures, and data generated by and/or used by other types of hosts. A popular form of flash memory is a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of flash memory systems in widespread use is the flash drive, which is a hand held memory system in a small elongated package that has a Universal Serial Bus (USB) plug for connecting with a host by plugging it into the host's USB receptacle. SanDisk Corporation, assignee hereof, sells flash drives under its Cruzer, Ultra and Extreme Contour trademarks. In yet another form of flash memory systems, a large amount of memory is permanently installed within host systems, such as within a notebook computer in place of the usual disk drive mass data storage system. Each of these three forms of mass data storage systems generally includes the same type of flash memory arrays. They each also usually contain its own memory controller and drivers but there are also some memory only systems that are instead controlled at least in part by software executed by the host to which the memory is connected. The flash memory is typically formed on one or more integrated circuit chips and the controller on another circuit chip. But in some memory systems that include the controller, especially those embedded within a host, the memory, controller and drivers are often formed on a single integrated circuit chip.

There are two primary techniques by which data are communicated between the host and flash memory systems. In one of them, addresses of data files generated or received by the system are mapped into distinct ranges of a continuous logical address space established for the system. The extent of the address space is typically sufficient to cover the full range of addresses that the system is capable of handling. As one example, magnetic disk storage drives communicate with computers or other host systems through such a logical address space. The host system keeps track of the logical addresses assigned to its files by a file allocation table (FAT) and the memory system maintains a map of those logical addresses into physical memory addresses where the data are stored. Most memory cards and flash drives that are commercially available utilize this type of interface since it emulates that of magnetic disk drives with which hosts have commonly interfaced.

In the second of the two techniques, data files generated by an electronic system are uniquely identified and their data logically addressed by offsets within the file. Theses file identifiers are then directly mapped within the memory system into physical memory locations. Both types of host/memory system interfaces are described and contrasted elsewhere, such as in patent application publication no. US 2006/0184720 A1.

Flash memory systems typically utilize integrated circuits with arrays of memory cells that individually store an electrical charge that controls the threshold level of the memory cells according to the data being stored in them. Electrically conductive floating gates are most commonly provided as part of the memory cells to store the charge but dielectric charge trapping material is alternatively used. A NAND architecture is generally preferred for the memory cell arrays used for large capacity mass storage systems. Other architectures, such as NOR, are typically used instead for small capacity memories. Examples of NAND flash arrays and their operation as part of flash memory systems may be had by reference to U.S. Pat. Nos. 5,570,315, 5,774,397, 6,046,935, 6,373,746, 6,456,528, 6,522,580, 6,643,188, 6,771,536, 6,781,877 and 7,342,279.

The amount of integrated circuit area necessary for each bit of data stored in the memory cell array has been reduced significantly over the years, and the goal remains to reduce this further. The cost and size of the flash memory systems are therefore being reduced as a result. The use of the NAND array architecture contributes to this but other approaches have also been employed to reducing the size of memory cell arrays. One of these other approaches is to form, on a semiconductor substrate, multiple two-dimensional memory cell arrays, one on top of another in different planes, instead of the more typical single array. Examples of integrated circuits having multiple stacked NAND flash memory cell array planes are given in U.S. Pat. Nos. 7,023,739 and 7,177,191.

Another type of re-programmable non-volatile memory cell uses variable resistance memory elements that may be set to either conductive or non-conductive states (or, alternately, low or high resistance states, respectively), and some additionally to partially conductive states and remain in that state until subsequently re-set to the initial condition. The variable resistance elements are individually connected between two orthogonally extending conductors (typically bit and word lines) where they cross each other in a two-dimensional array. The state of such an element is typically changed by proper voltages being placed on the intersecting conductors. Since these voltages are necessarily also applied to a large number of other unselected resistive elements because they are connected along the same conductors as the states of selected elements being programmed or read, diodes are commonly connected in series with the variable resistive elements in order to reduce leakage currents that can flow through them. The desire to perform data reading and programming operations with a large number of memory cells in parallel results in reading or programming voltages being applied to a very large number of other memory cells. An example of an array of variable resistive memory elements and associated diodes is given in patent application publication no. US 2009/0001344 A1.

A three dimensional (3D) memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

An issue with 3D memory array is the large number of word lines and bit lines that need to be deployed and more particularly, the requirement for a large number of word line drivers and bit line drivers that occupy space. Existing 3D memory has an array of bit line CMOS drivers formed on the substrate below the footprint of the stacked memory planes. That leaves no room for additional word line drivers, which must be located elsewhere on the substrate.

U.S. Published Application No. 2009/0122598 to Toda, et al ("Toda"), or U.S. Published Application No. 2010/0289084 to Yoon, et al ("Yoon") disclose extending the word lines outside the edge of the memory area and connect each via a zia to a CMOS transistor in the substrate. The CMOS transistor acts as a switch and word line driver. This has the disadvantage of increasing the die size of the memory. The more word lines in each plane and the more planes in the 3D memory, the more number of zias and word line drivers will be needed, which occupy additional die space.

U.S. Pat. No. 8,547,720 discloses a 3D memory where a portion of the vertical bit lines are used to access the word lines. Each word line is extended to an outside region beyond the memory elements to which it serves and a connector or contact is used to provide the electric conduction between the word line and a vertical bit line in the outside region. However, many of the processes in manufacturing the memory device have the structures in multiple memory layers formed in parallel and are often not amenable to replacing memory elements by metal connectors at different locations of each memory plane.

The need remains for a 3D memory having efficient and compact implementation of word line and bit line decoding.

SUMMARY OF THE INVENTION

According to a general framework of the invention, a 3D memory includes memory elements arranged in a three-dimensional pattern defined by rectangular coordinates having x, y and z-directions and with a plurality of parallel planes stacked in the z-direction. The memory elements in each plane are accessed by a plurality of word lines and relatively short local bit lines in tandem with a plurality of global bit lines. The plurality of local bit lines are in the z-direction through the plurality of planes and arranged in a two dimensional rectangular array of rows in the x-direction and columns in the y-directions. The plurality of word lines in each plane are elongated in the x-direction and spaced apart in the y-direction between and separated from the plurality of local bit lines in the individual planes. A non-volatile, reprogramming memory element is located near a crossing between a word line and local bit line and accessible by the word line and local bit line and wherein a group of memory elements are accessible in parallel by a common word line and a row of local bit lines.

The memory has the structure of a 3D resistive mesh. The memory elements used in the three-dimensional array are preferably variable resistive memory elements. That is, the resistance (and thus inversely the conductance) of the individual memory elements is typically changed as a result of a voltage placed across the orthogonally intersecting conductors to which the element is connected. Depending on the type of variable resistive element, the state may change in response to a voltage across it, a level of current though it, an amount of electric field across it, a level of heat applied to it, and the like. With some variable resistive element material, it is the amount of time that the voltage, current, electric field, heat and the like is applied to the element that determines when its conductive state changes and the direction in which the change takes place. In between such state changing operations, the resistance of the memory element remains unchanged, so is non-volatile. The three-dimensional array architecture summarized above may be implemented with a memory element material selected from a wide variety of such materials having different properties and operating characteristics.

Efficient Decoding of Word Lines by Cell-Selection in a Vertical Bit Line Architecture A three-dimensional (3D) array of memory elements is formed across multiple layers of planes positioned at different distances above a semiconductor substrate. The memory elements generally reversibly change a level of electrical conductance in response to a voltage difference being applied across them. The three-dimensional array includes a two-dimensional array of pillar lines from the substrate through the multiple layers of planes. The pillar lines are either first-type or second type pillar lines. First-type pillar lines are employed to act as local bit lines for accessing the memory elements in the 3D array. Second-type pillar lines are employed to access the word lines via respective connecting memory elements that have been preset permanently to a low resistance state. A row of global lines (metal lines) is switchably connected to individual rows of the pillar lines to provide access to the first-type and second-type pillar lines, thereby to provide access respectively to the local bit lines and word lines of the three-dimensional array. Each of the second-type pillars is exclusively for accessing one word line via a respective memory element that acts as a conductor after the memory element has been preset to a conductive state in an overset mode which subsequently cannot be reset to a less conductive state.

In one embodiment, the memory elements connected to the first-type and second-type pillars are the same, except the memory elements that act as conductors for accessing the word lines have been preset to a conductive state in an overset mode which subsequently cannot be reset to a less conductive state.

In another embodiment, the memory elements that act as conductors for accessing the word lines are constituted from an one-time programmable material that includes SiOx.

Each word line has at least one second-type pillar line that is exclusively connected to the word line via a second-type memory element.

In yet another embodiment, a word line associated with a row of pillar lines is accessed in parallel at multiple locations by multiple second-type pillar lines among the row of pillar lines.

In yet another embodiment, a plurality of select devices are employed to switch the pillar lines row by row to the array of global lines. The select devices are formed in a semiconductor switching layer above the semiconductor substrate and the multiple layers of planes are formed as a stack over the semiconductor switching layer. This will free up room on the substrate for other type of circuit elements.

This provides a highly scalable architecture for decoding bit lines and word lines. For example, one of the causes of leakage in the resistive mesh is due to finite resistance across the length of individual word lines. The word lines can be segmented to reduce their resistance. The segmented word lines can be readily accessed by appropriating more of the pillar lines and metal lines to the increased number of segments. The memory elements are uniform and the pillar lines are also uniform, which result in a device with a highly repeated pattern that is simple to process.

Various aspects, advantages, features and details of the innovative three-dimensional variable resistive element memory system are included in a description of exemplary examples thereof that follows, which description should be taken in conjunction with the accompanying drawings.

All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DESCRIPTION OF EXEMPLARY EMBODIMENTS

Figure 1:
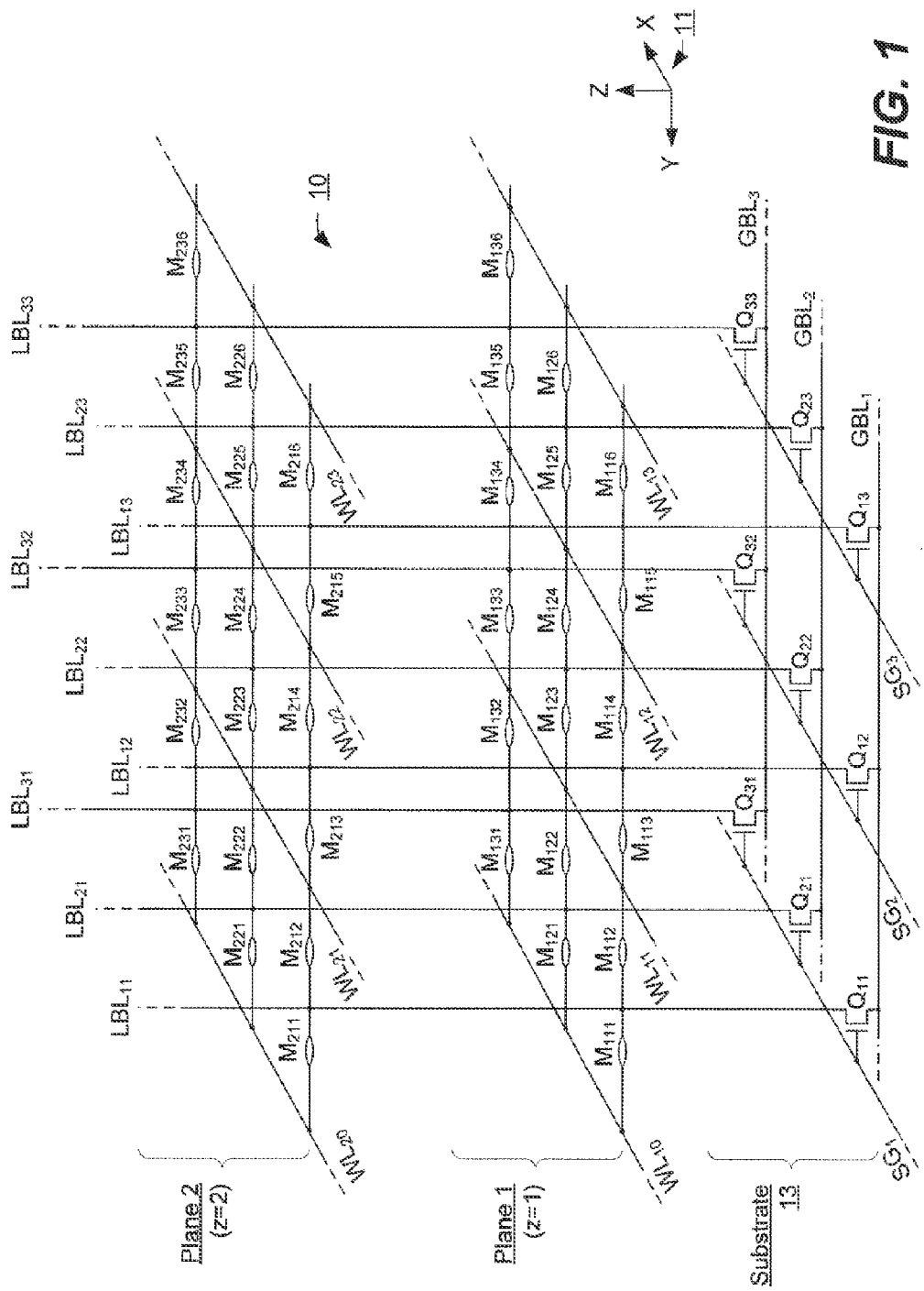
FIG. 1 is an equivalent circuit of a portion of a three-dimensional array of variable resistance memory elements, wherein the array has vertical bit lines.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

Associated circuitry is typically required for proper operation of the memory elements and for proper communication with the memory elements. This associated circuitry may be on the same substrate as the memory array and/or on a separate substrate. As non-limiting examples, the memory devices may have driver circuitry and control circuitry used in the programming and reading of the memory elements.

One of skill in the art will recognize that this invention is not limited to the two dimensional and three dimensional exemplary structures described but cover all relevant memory structures within the spirit and scope of the invention as described herein and as understood by one of skill in the art.

Referring initially to FIG. 1, an architecture of a three-dimensional memory 10 is schematically and generally illustrated in the form of an equivalent circuit of a portion of such a memory. This is a specific example of the three-dimensional array using ReRAM mentioned above. A standard three-dimensional rectangular coordinate system 11 is used for reference, the directions of each of vectors x, y and z being orthogonal with the other two.

In this example, a circuit for selectively connecting internal memory elements with external data circuits is preferably formed as CMOS switches in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, control gate lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the control gate lines $SG_y$ receives a voltage that turns on the select devices to which it is connected. The remaining control gate lines receive voltages that keep their connected select devices off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory storage elements $M_{zxy}$ are formed in a plurality of planes positioned at different distances in the z-direction above the substrate 13. Two planes 1 and 2 are illustrated in FIG. 1 but there will typically be more, such as 4, 6 or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Figure 2:
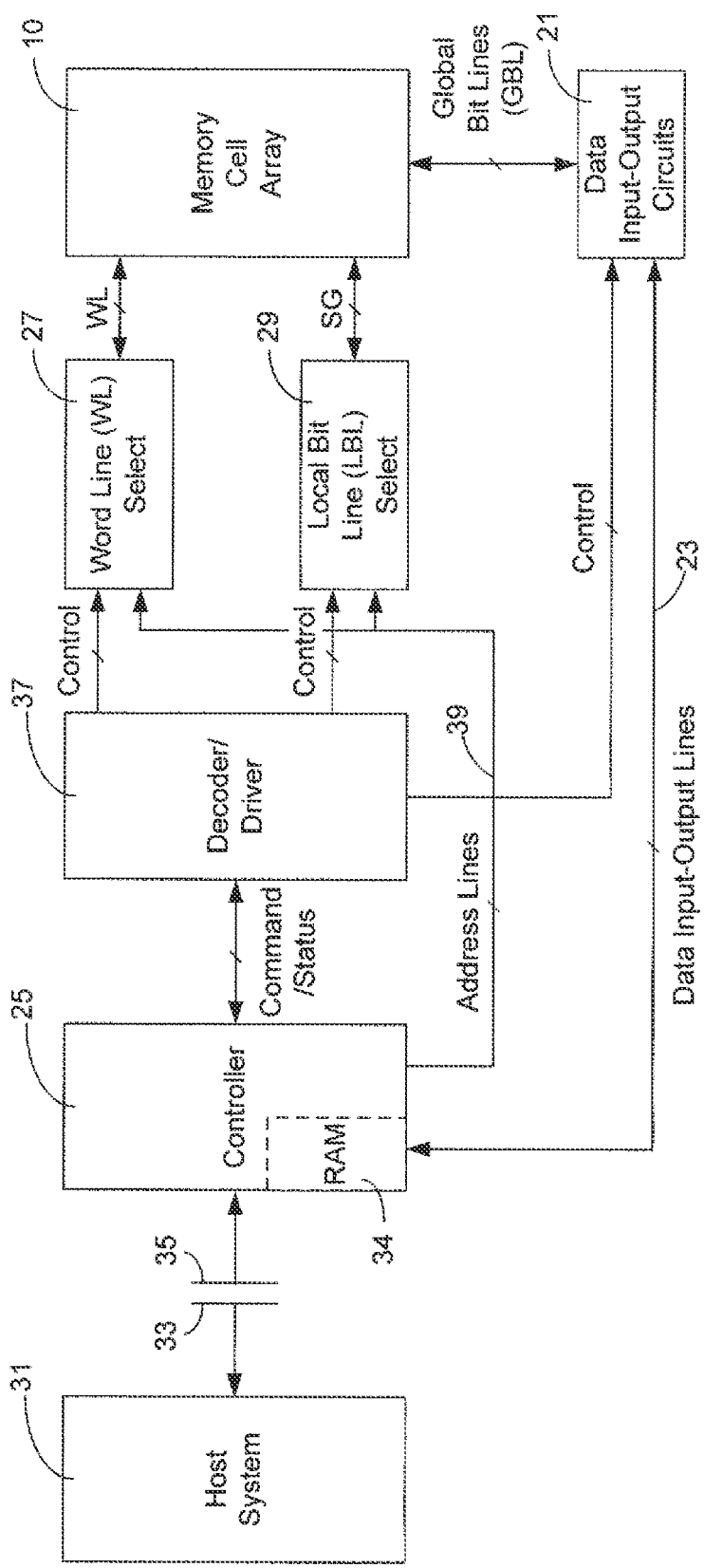
FIG. 2 is a schematic block diagram of a re-programmable non-volatile memory system which utilizes the memory cell array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed storage elements $M_{zxy}$. The circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and select gate control lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

The memory system controller 25 typically receives data from and sends data to a host system 31. The controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

The memory system controller 25 conveys to decoder/driver circuits 37 commands received from the host. Similarly, status signals generated by the memory system are communicated to the controller 25 from the circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory element array 10 of FIG. 1, the system is not limited to use of only that array architecture. A given memory system may alternatively combine this type of memory with other another type including flash memory, such as flash having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. Accordingly, the memory elements will also be referred to as Read/Write (R/W) elements. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory cell arrays. Resetting a block of memory elements to a common state corresponds to erasing a block of flash memory cells to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
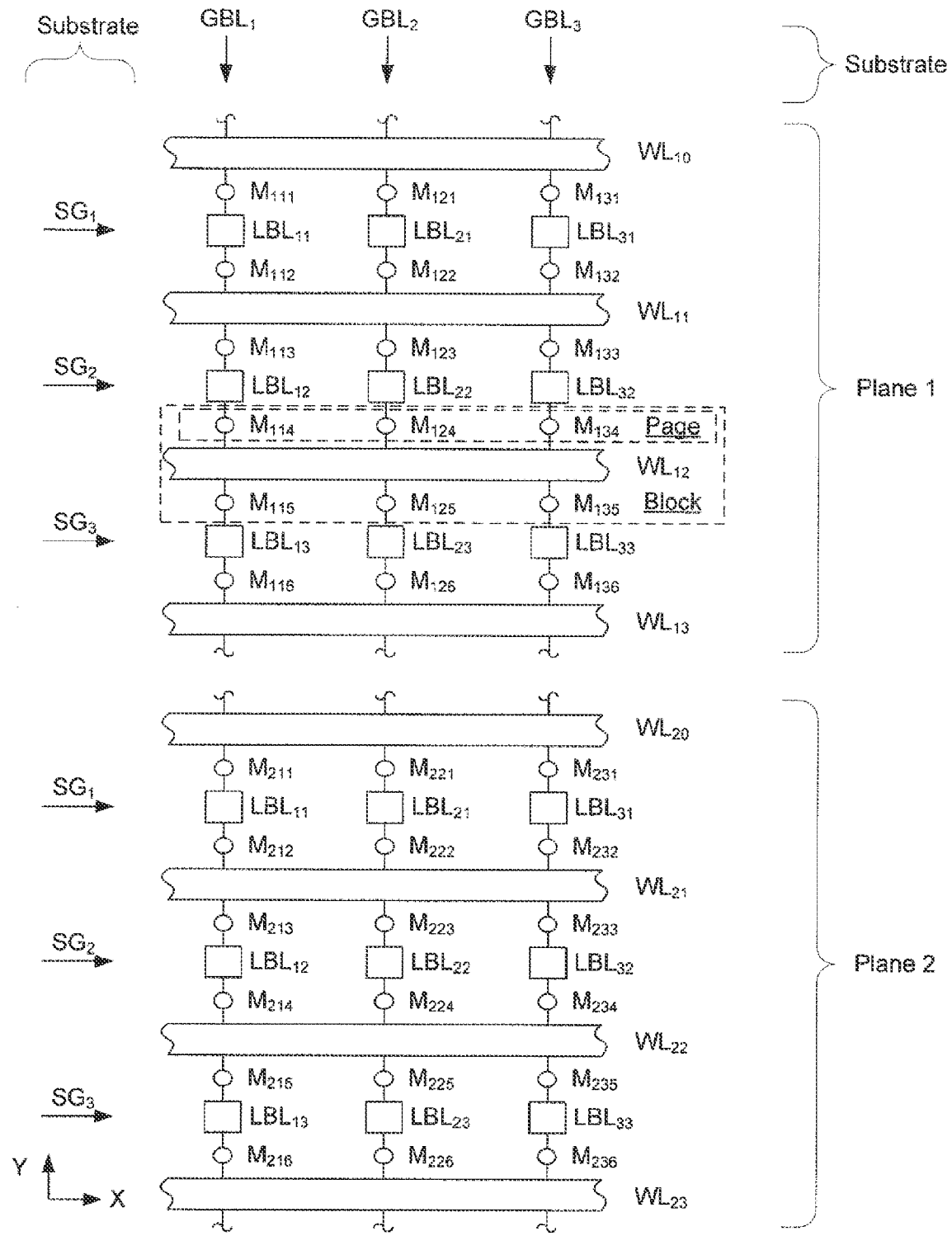
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

General Considerations for RESET (Erase), SET (Program) and READ

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1", depending upon the memory element state.

To reset (erase) a block of memory elements, the memory elements in that block are placed into their high resistance state. This state will be designated as the logical data state "1", following the convention used in current flash memory arrays but it could alternatively be designated to be a "0". As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to Vss (e.g., zero volts), by the circuits 21 of FIG. 2.
2. Set at least the two select gate lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, like something in a range of 1-3 volts, typically 2 volts. The block shown in FIG. 3 includes the word line $WL_{12}$, so the select gate lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.
3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1". For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
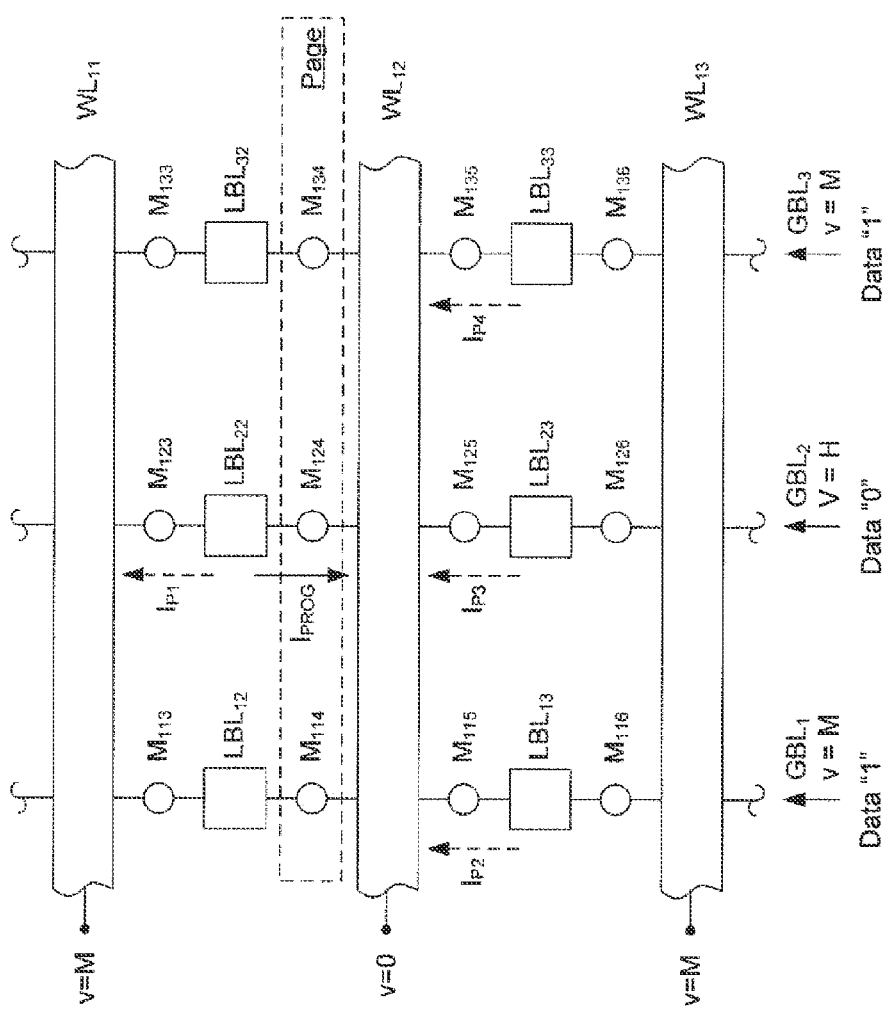
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, an M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the select gate lines below and on either side of the selected word line to the H' voltage level, in order to select a page for programming. For the page indicated in FIGS. 3 and 4, the H' voltage is placed on select gate line $SG_2$ in order to turn on select devices $Q_{12}$, $Q_{22}$ and $Q_{32}$ (FIG. 1). All other select gate lines, namely lines $SG_1$ and $SG_3$ in this example, are set to 0 volts in order to keep their select devices off. The select gate line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected select gate line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-8 planes may generally be used in most cases.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
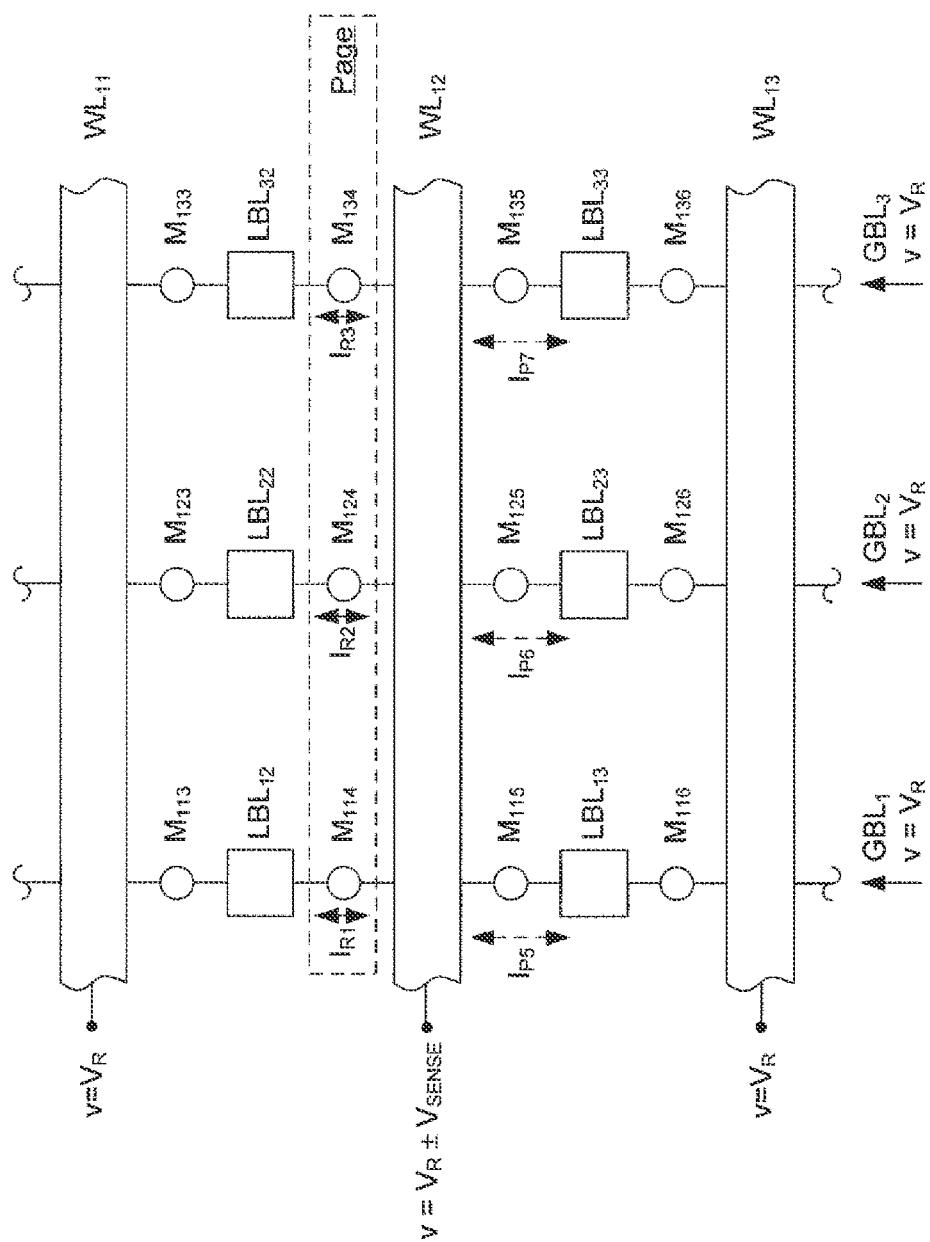
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn on one row of select devices by placing a voltage on the control line adjacent to the selected word line in order to define the page to be read. In the example of FIGS. 1 and 5, a voltage is applied to the control line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.

3. Set the selected word line ($WL_{12}$) to a voltage of $V_R \pm V_{sense}$. The sign of Vsense is chosen based on the sense amplifier and has a magnitude of about 0.5 volt. The voltages on all other word lines remain the same.

4. Sense current flowing into ($V_R$+Vsense) or out of ($V_R$−Vsense) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.

5. Turn off the select devices ($Q_{12}$, $Q_{22}$ and $Q_{32}$) by removing the voltage from the select gate line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R \pm V_{sense}$ without flowing through the sense amplifiers. These parasitic currents will not flow through the selected local bit lines ($LBL_{12}$, $LBL_{22}$ and $LBL_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V_{sense}$ but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p-n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials.

The level of parasitic currents increases with the number of planes and with the number of memory elements connected along the individual word lines within each plane. But since the number of word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory cell to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory cells on each current path and thus the leakage currents are reduced as is the number of unselected cells disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 8), or N+n cells are associated with a data operation. For a large N this means that the number of cells affected by a data operation is approximately one-half as many as in a conventional three-dimensional array.

Materials Useful for the Memory Storage Elements

The material used for the non-volatile memory storage elements $M_{zxy}$ in the array of FIG. 1 can be a chalcogenide, a metal oxide, or any one of a number of materials that exhibit a stable, reversible shift in resistance in response to an external voltage applied to or current passed through the material.

Figure 6:
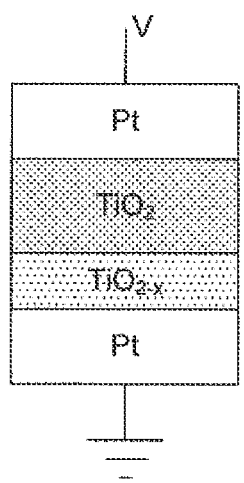
FIG. 6 illustrates an example memory storage element.

Metal oxides are characterized by being insulating when initially deposited. One suitable metal oxide is a titanium oxide ($TiO_x$). A previously reported memory element using this material is illustrated in FIG. 6. In this case, near-stoichiometric $TiO_2$ bulk material is altered in an annealing process to create an oxygen deficient layer (or a layer with oxygen vacancies) in proximity of the bottom electrode. The top platinum electrode, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+{}_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure of FIG. 6. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials include HfOx, ZrOx, WOx, NiOx, CoOx, CoalOx, MnOx, $ZnMn_2O_4$, ZnOx, TaOx, NbOx, HfSiOx, and HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, and $IrO_2$. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 5 nm to 50 nm.

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into a $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. The switching mechanism from low-to-high resistance and the opposite is not well understood. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Specific Structural Examples of the Three-Dimensional Array

Figure 7:
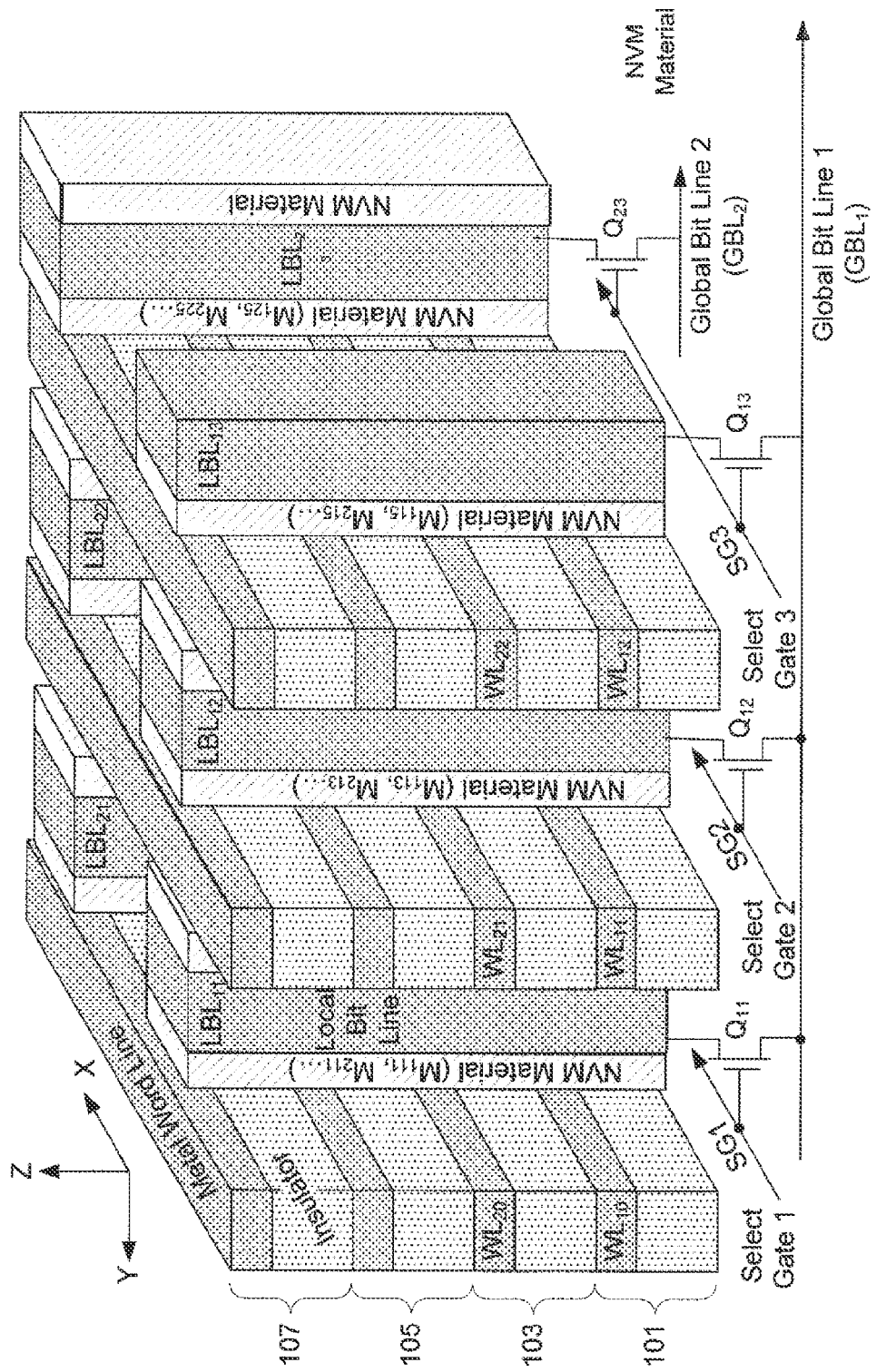
FIG. 7 is an isometric view of a portion of the three-dimensional array shown in FIG. 1.

A first example, illustrated in FIG. 7, is configured for use of memory element (NVM) material that is non-conductive when first deposited. FIG. 7 is an isometric view of a portion of the three-dimensional array shown in FIG. 1. A metal oxide of the type discussed above has this characteristic. As explained with respect to FIG. 6, conductive filaments are formed between electrodes on opposite sides of the material in response to appropriate voltages placed on those electrodes. These electrodes are a bit line and a word line in the array. Since the material is otherwise non-conductive, there is no necessity to isolate the memory elements at the crosspoints of the word and bit lines from each other. Several memory elements may be implemented by a single continuous layer of material, which in the case of FIG. 7 are strips of NVM material oriented vertically along opposite sides of the vertical bit lines in the y-direction and extending upwards through all the planes. A significant advantage of the structure of FIG. 7 is that all word lines and strips of insulation under them in a group of planes may be defined simultaneously by use of a single mask, thus greatly simplifying the manufacturing process.

Referring to FIG. 7, a small part of four planes 101, 103, 105 and 107 of the three-dimensional array are shown. Elements of the FIG. 7 array that correspond to those of the equivalent circuit of FIG. 1 are identified by the same reference numbers. It will be noted that FIG. 7 shows the two planes 1 and 2 of FIG. 1 plus two additional planes on top of them. All of the planes have the same horizontal pattern of gate, dielectric and memory storage element (NVM) material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the select gate lines (SG) elongated in the x-direction, which are also formed in the substrate. The switching devices $Q_{xy}$ may be conventional CMOS transistors (or vertical NPN transistors) and fabricated using the same process as used to form the other conventional circuitry. In the case of using NPN transistors instead of MOS transistors, the select gate (SG) lines are replaced with the base contact electrode lines elongated in the x-direction. Also fabricated in the substrate but not shown in FIG. 7 are sense amplifiers, input-output (I/O) circuitry, control circuitry, and any other necessary peripheral circuitry. There is one select gate line (SG) for each row of local bit line pillars in the x-direction and one select device (Q) for each individual local bit line (LBL).

Each vertical strip of non-volatile memory element (NVM) material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 7 is as follows:

1. The support circuitry, including the select devices Q, global bit lines GBL, select gate lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 7, four such sheets are formed.
3. These sheets are then etched (isolated) by using a mask formed over the top of them that has slits elongated in the x-direction and spaced apart in the y-direction. All of the material is removed down to the etch stop in order to form the trenches shown in FIG. 7 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. Non-volatile memory (NVM) material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Metal is then deposited in these trenches in order to make contact with the non-volatile memory (NVM) material. The metal is patterned using a mask with slits in the y-direction. Removal of the metal material by etching through this mask leaves the local bit line (LBL) pillars. The non-volatile memory (NVM) material in the x-direction may also be removed between pillars. The space between pillars in the x-direction is then filled with a dielectric material and planarized back to the top of the structure.

A significant advantage of the configuration of FIG. 7 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

Pillar Switches Formed in a Pillar Select Layer Above the Substrate

In the 3D array with its 2D array of pillar lines acting as local vertical bit lines, a select transistor is needed to switch each pillar line to a metal line on the substrate for access. Thus a 2D array of select transistors is needed. The select or switching transistors are conventionally CMOS circuit elements that are formed in a semiconductor CMOS substrate. These CMOS switches have efficient driving power. However, they will also take up the room in the substrate and leave little room for other active elements.

In another embodiment, the switching transistors are form in a separate layer above the CMOS substrate. Each select transistor is a pillar select device that is formed as a vertical thin film transistor (VTFT), switching between a local bit line pillar and a global bit line. The pillar select devices, unlike previous embodiments where they are formed within a CMOS substrate layer, are formed in a separate layer (pillar select layer) above the CMOS substrate layer, along the z-direction between the array of global bit lines and the array of local bit lines.

The 3D structure can be regarded as comprising two portions. A base portion, commonly referred to as FEOL ("Front End Of (Manufacturing) Line"), is supported by a semiconductor substrate on which active elements may be formed.

Above the base portion is a second portion, referred to as BEOL ("Back End Of (Manufacturing) Line"). BEOL is where the multiple layers of R/W material, word lines and vertical local bit lines are formed. The local bit lines are connected to the structures in the FEOL portion via respective contact pads. Along the z-direction, a stack of memory element layers is formed. At each layer, each row of local bit lines is crossed by but spaced apart from at least one word lines WL.

Figure 8:
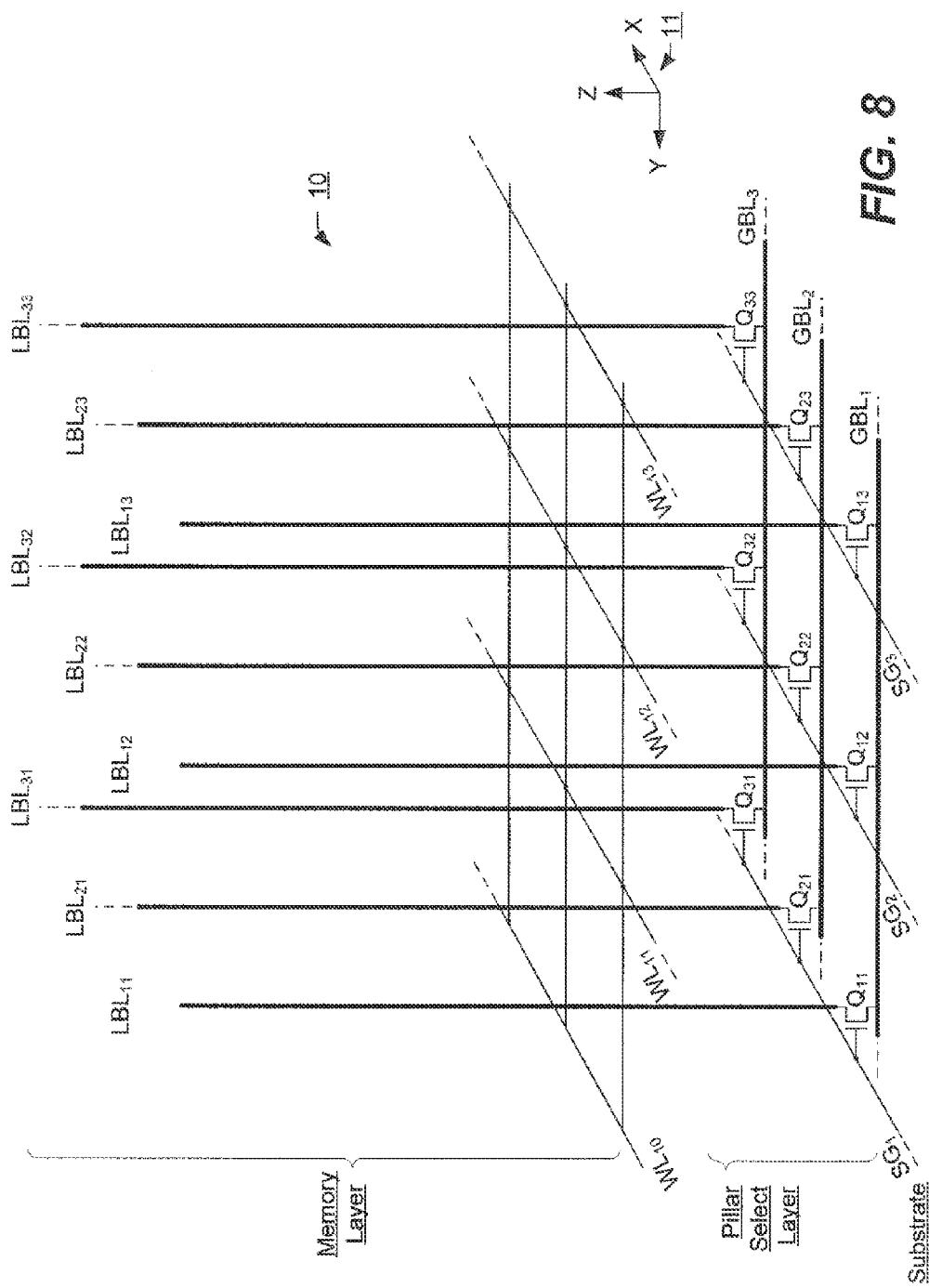
FIG. 8 illustrates schematically the 3D memory alternatively comprising of a memory layer on top of a pillar select layer.

FIG. 8 illustrates schematically the 3D memory alternatively comprising a memory layer on top of a pillar select layer. The 3D memory 10 is formed on top of a CMOS substrate (not shown explicitly) where structures in the CMOS are in the FEOL ("Front End of Lines") layer. However, unlike FIG. 1, the select devices switching individual bit lines to individual global bit lines are now formed on top of the FEOL layer in the BEOL. Thus, the BEOL comprises of the pillar select layer with the memory layer on top of it. The select devices such as $Q_{11}, Q_{12}, \ldots, Q_{21}, Q_{22}, \ldots$, etc., are formed in the pillar select layer. The memory layer typically comprises multiple layers of word lines and R/W elements. For simplicity, FIG. 8 shows only one layer of word lines, such as $WL_{10}, W_{11}, \ldots$, etc., without showing the R/W elements that exist between each crossing of a word line and a bit line.

Figure 9B:
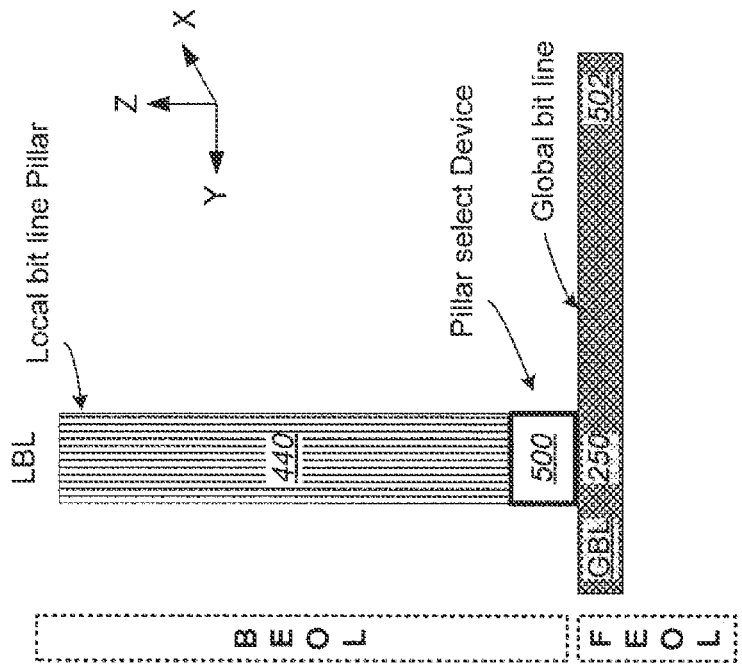
FIG. 9B illustrates the structure of the pillar select device in relation to the local bit line and the global bit line.
Figure 9A:
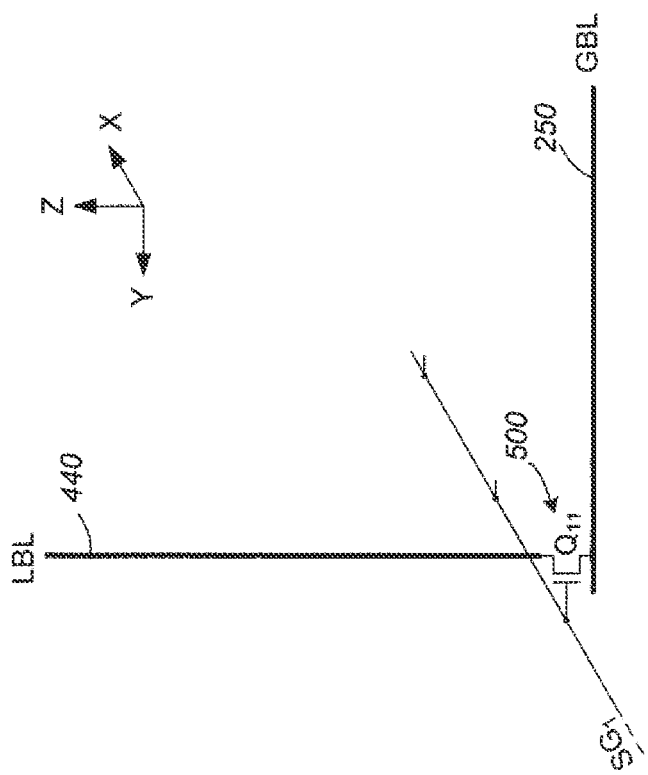
FIG. 9A illustrates a schematic circuit diagram of a given pillar select device switching a local bit line to a global bit line.

FIG. 9A illustrates a schematic circuit diagram of a given pillar select device switching a local bit line to a global bit line. In the example, the local bit line LBL 440 is switchable to the global bit line GBL 250 by a select transistor 500 such as $Q_{11}$. The gate of the select transistor $Q_{11}$ is controllable by a signal exerted on a block select line $SG_1$.

FIG. 9B illustrates the structure of the pillar select device in relation to the local bit line and the global bit line. The global bit line such as GBL 250 is formed in the FEOL as part of the metal layer-1 or metal layer-2 502. The pillar select device in the form of the select transistor 500 is formed in the BEOL layer on top of the GBL 250. The local bit line LBL 440, in the form of a pillar, is formed on top of the pillar select device 500. In this way, the pillar select device 500 can switch the local bit line pillar LBL to the global bit line GBL.

U.S. Published Application No. 2012-0147650, published on Jun. 14, 2012 provides a disclosure of a pillar select layer formed between a substrate below and memory layers above, the entire disclosure is incorporated herein by reference.

Efficient Decoding of Vertical Bit Lines and Horizontal Word Lines

In the 3D memory with Vertical bit lines (VBL) as shown in FIG. 1 and FIG. 7, each row (along the x-direction) of vertical bit lines in the z-direction can be accessed by being switchably connected to a row of global bit lines in the y-direction. The same is not true for the word lines, which lie in each of the memory plane in the x-direction.

At each memory plane a plurality of word lines need to be accessed and decoded. U.S. Published Application No. 2009/0122598 to Toda, et al and U.S. Published Application No. 2010/0289084 to Yoon, et al disclose extending the word lines outside the edge of the memory area and connect each via a zia to a CMOS transistor in the substrate. The CMOS transistor acts as a switch and word line driver. This has the disadvantage of increasing the die size of the memory. The more word lines in each plane and the more planes in the 3D memory, the more number of zias and word line drivers will be needed, which occupy additional die space.

Figure 10:
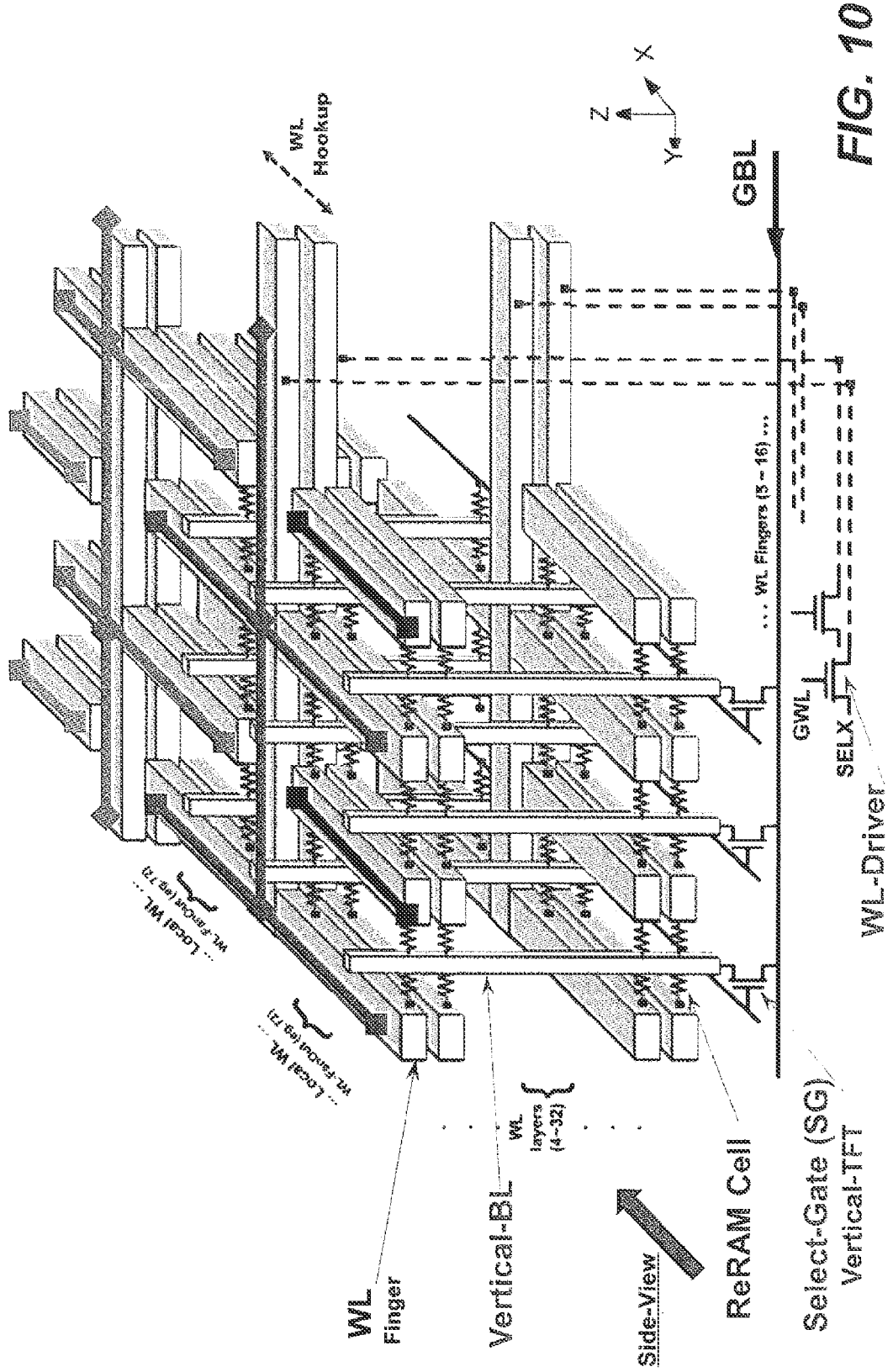
FIG. 10 is an isometric view of a portion of an existing three-dimensional array memory array with VBL architecture and having word lines with comb structures.

One way to reduce the number of word line access is to have multiple word lines tied together to share a common zia and word line driver. FIG. 10 is an isometric view of a portion of an existing three-dimensional array memory array with VBL architecture and having word lines with comb structures. The memory is similar to the 3D memory illustrated in FIG. 1, except the word lines at each memory plane are each in the form of a comb. In the example shown, each comb has multiple fingers, effectively combining multiple word lines into one and reducing the number of word line access in each plane. This means the number of zias and word line drivers (SELX) needed per memory plane is reduced. With a much reduced number of word line drivers per memory plane, it has been proposed to locate the word line drivers under the area occupied by the memory.

Figure 11:
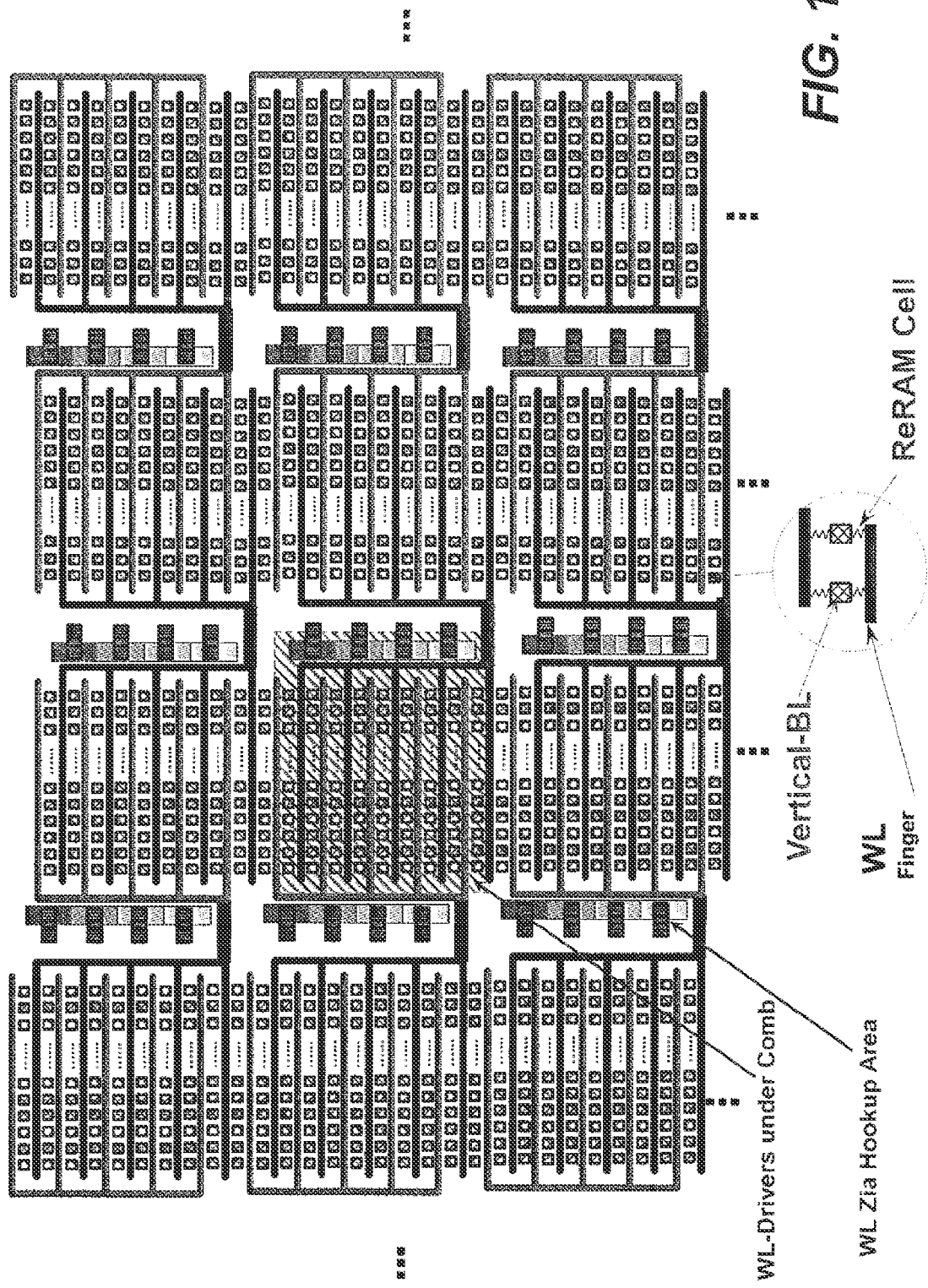
FIG. 11 is a plan view of the existing memory architecture shown in FIG. 10, illustrating the layout of two word line combs as a unit in each memory plane.

FIG. 11 is a plan view of the existing memory architecture shown in FIG. 10, illustrating the layout of two word line combs as a unit in each memory plane. In the example, there are four memory planes and each memory plane has a number of word line combs. Each comb has five fingers, effectively sharing five word lines with a common zia and word line driver. In particular, the layout is such that the plane is covered by rectangular units, each having a pair of interleaved word line combs and a bank of zias, one zia for each memory plane. The design requires fitting the word line driver's layout under each rectangular unit. Since the numbers of word line drivers is proportional to the number of memory planes, this requirement has the disadvantage of a lack of scalability. This is because with increasing number of memory planes, the proportional increase in the number of word line drivers will eventually use up all the room under each rectangular unit, thereby limiting the maximum number of memory planes allowed.

Sharing more word lines with each zia and word line driver will help to reduce the number of word line drivers. However, this also means a corresponding increase in current that must be handled by the common zia and word line driver, which results in larger sizes of the zia and the word line driver. Thus, having word line combs with more fingers does not reduce the space required by the word line drivers.

Reducing various operating currents will help in reducing the size of the word line drivers. For example, improved ways may be found to reduce the memory cell's set and reset currents. Similarly, the CMOS word line driver may be made to drive more efficiently and to provide a higher current capacity without an increase in size. Still, these measures are limited and do not enable the memory device to be scaled easily.

Therefore, for existing 3D memory with VBL architecture and word line comb structures, the word-line driver layout is the limiting factor for die size, especially if cell current cannot be reduced in future scaling.

U.S. Pat. No. 8,547,720 discloses a 3D memory where a portion of the vertical bit lines are used to access the word lines. Each word line is extended to an outside region beyond the memory elements to which it serves and a connector or contact is used to provide the electric conduction between the word line and a vertical bit line in the outside region. However, many of the processes in manufacturing the memory device have the structures in multiple memory layers formed in parallel and are often not amenable to replacing memory elements by metal connectors at different locations of each memory plane.

Efficient Decoding of Word Lines by Cell-Selection in a Vertical Bit Line Architecture A three-dimensional (3D) array of memory elements is formed across multiple layers of planes positioned at different distances above a semiconductor substrate. The memory elements generally reversibly change a level of electrical conductance in response to a voltage difference being applied across them. The three-dimensional array includes a two-dimensional array of pillar lines from the substrate through the multiple layers of planes. The pillar lines are either first-type or second type pillar lines. First-type pillar lines are employed to act as local bit lines for accessing the memory elements in the 3D array. Second-type pillar lines are employed to access the word lines via respective connecting memory elements that have been preset permanently to a low resistance state. A row of global lines (metal lines) is switchably connected to individual rows of the pillar lines to provide access to the first-type and second-type pillar lines, thereby to provide access respectively to the local bit lines and word lines of the three-dimensional array. Each of the second-type pillars is exclusively for accessing one word line via a respective memory element that acts as a conductor after the memory element has been preset to a conductive state in an overset mode which subsequently cannot be reset to a less conductive state.

Figure 12:
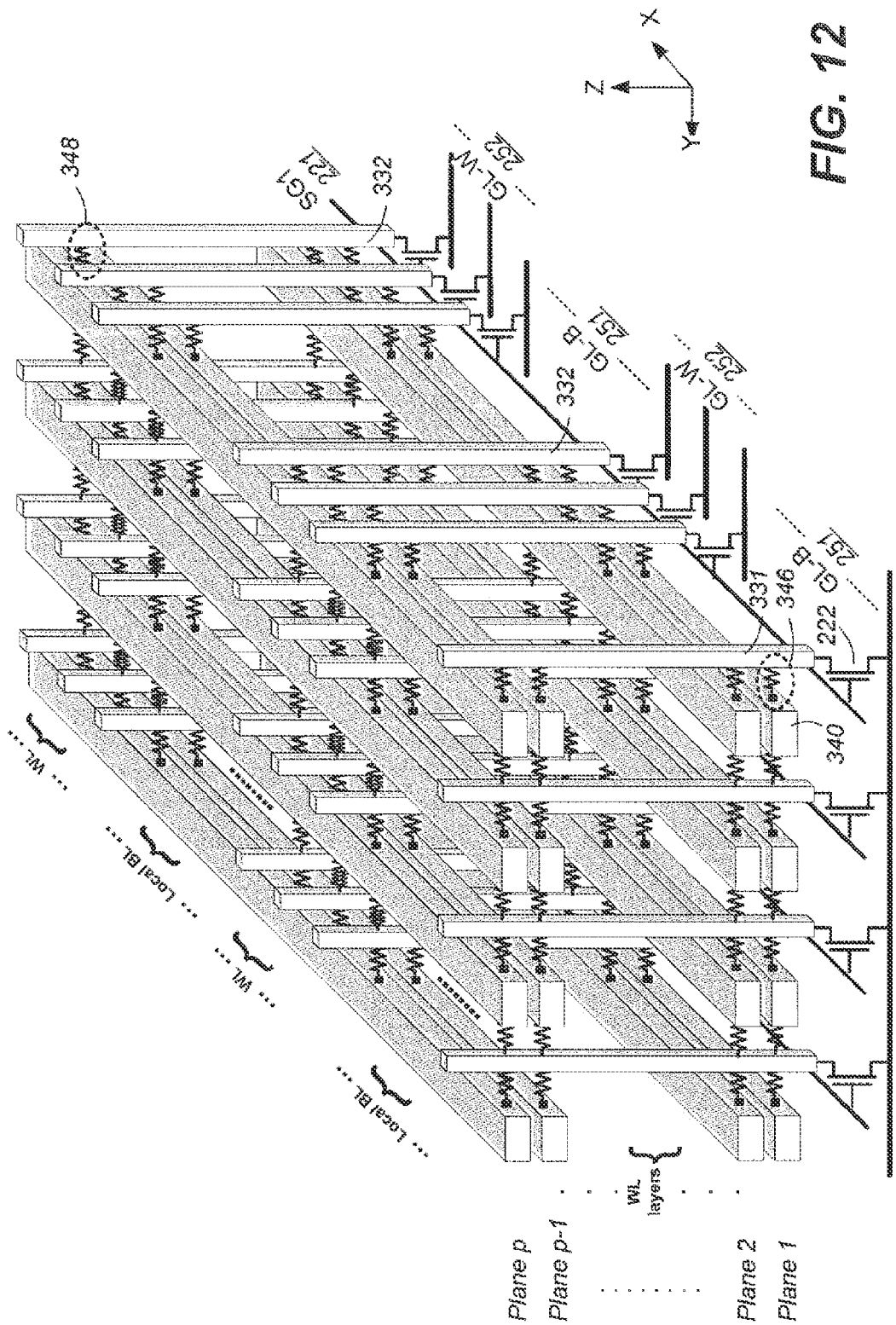
FIG. 12 is an isometric view of a portion of the three-dimensional array, illustrating an efficient decoding of vertical bit lines and horizontal word lines according to the present invention.

FIG. 12 is an isometric view of a portion of the three-dimensional array, illustrating an efficient decoding of vertical bit lines and horizontal word lines according to the present invention. An example 3D array with multiple memory layers or planes 1-p stacked along the z-direction is shown. Each memory layer is accessible by a 2D array of pillar lines 331 and 332 in the z-direction. The 2D array of pillar lines consists of a first-type 331 that acts as a local bit line and a second-type 332 that acts as connection to access a cell-selected word line. A row of pillar lines containing first-type and second-type pillar lines 331 and 332 are switchably connected to a row of global lines containing first-type and second-type global lines. The first-type pillar lines 331 are switchably connected to first-type global lines GL-B 251 and the second-type pillar lines 332 are switchably connected to second-type global lines GL-W 252. In a similar labeling scheme, a second-type memory 348 is disposed between a second-type pillar line 332 and a word line 340 and is preset to a conductive state so that the second-type pillar is exclusively connected to the word line 340 via the second-type memory 348. First-type memory elements 346 are disposed between all other crossings formed between word lines 340 and first-type pillar lines 331 or second-type pillar lines 332 but excluding crossings occupied by the second-type memory elements in the 3D array.

In one embodiment, the first-type memory element 346 and the second-type memory element 348 are essentially the same memory elements. They have a resistance that reversibly shifts in resistance in response to an applied voltage or a passing current. However, the second-type memory elements 348 are preset at the factory into a conductive state in an overset mode which cannot subsequently be reset to a less conductive state. In this way, the second type of memory element 348 effectively acts as conducting connector between the word line 340 and the second-type pillar line 332 and the second-type pillar line 332 can be regarded as an extension of the word line 340.

The connections of the first-type global lines GL-B 251 to a row of first-type pillar lines 331 and the global bit lines GL-W 252 to a selected word line 340 via corresponding second-type pillar line 332 are effected by switching a row of select devices 222 controlled by a select line 221 such as $SG_1$ acting as a page select line.

Thus, a selected page/block is decoded by asserting the block select line $SG_1$. As described before, the first-type memory elements 346 in the page are accessible by the first-type global lines GL-B 251 via the first-type pillar lines 331. A selected word line 340 is accessed by the second-type global lines 252 via the second-type pillar lines 332. Sensing circuits can be connected to the first-type global lines GL-B 251 for sensing the memory state of the first-type memory elements 346 in the page.

Figure 13:
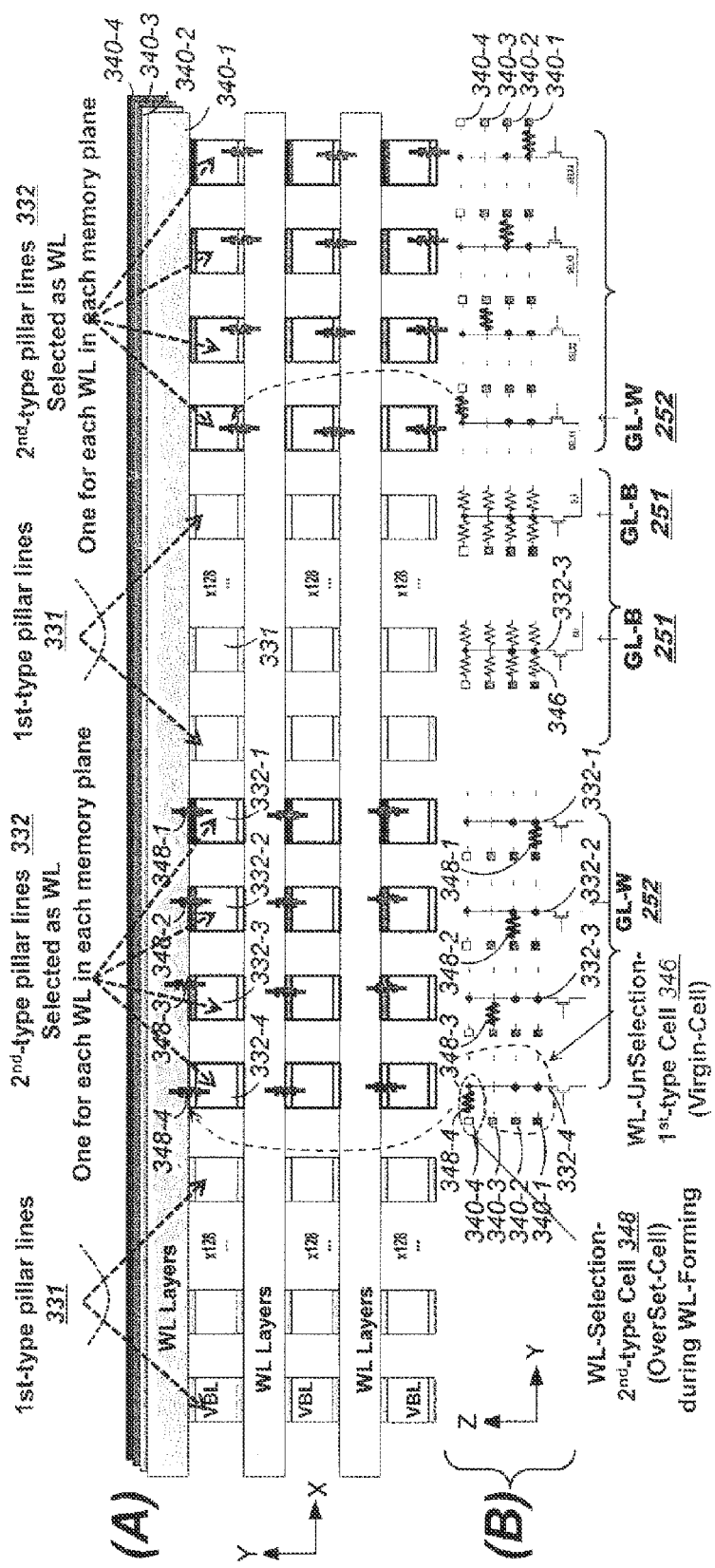
FIG. 13(A) is a plan view of the three-dimensional array of FIG. 12.
FIG. 13(B) is a sectional view of the three-dimensional array of FIG. 13(A)

FIG. 13(A) is a plan view of the three-dimensional array of FIG. 12. The example shown has four memory planes with word lines 340-1, 340-2, 340-3 and 340-4 respectively residing on memory planes 1, 2, 3 and 4, starting from the bottom. It will be seen that the row of pillar lines adjacent the word lines 340-1 to 340-4 consists of either first-type or second-type pillar lines. A first-type pillar line 331 will have a first-type memory element 346 at each crossing with a word line. A second-type pillar line 332 will also have a first-type memory element 346 at each crossing with a word line except for one second-type memory element 348 that acts as a conductor to access an unique word line.

FIG. 13(B) is a sectional view of the three-dimensional array of FIG. 13(A). Each of the word lines 340-1 to 340-4 will have a second-type pillar line 332 dedicated to it. Thus, the second-type pillar line 332-4 is for accessing the word line 340-4 in plane 4. It is preselected by having the second-type memory element 348-4 in plane 4 preset to the conductive state. The other memory elements in planes 1-3 connected to the second-type pillar line 332-4 are unselected and remain as virgin cells (i.e., their memory elements are reset in high resistance state as shipped from the factory). Similarly, the second-type pillar line 332-3 is for accessing the word line 340-3 in plane 3 by having the second-type memory element 348-3 in plane 3 preset to the conductive state. Similarly, the second-type pillar lines 332-2 and 332-1 are for accessing the word lines 340-2 and 340-1 in plane 2 and plane 1 respectively.

Figure 14:
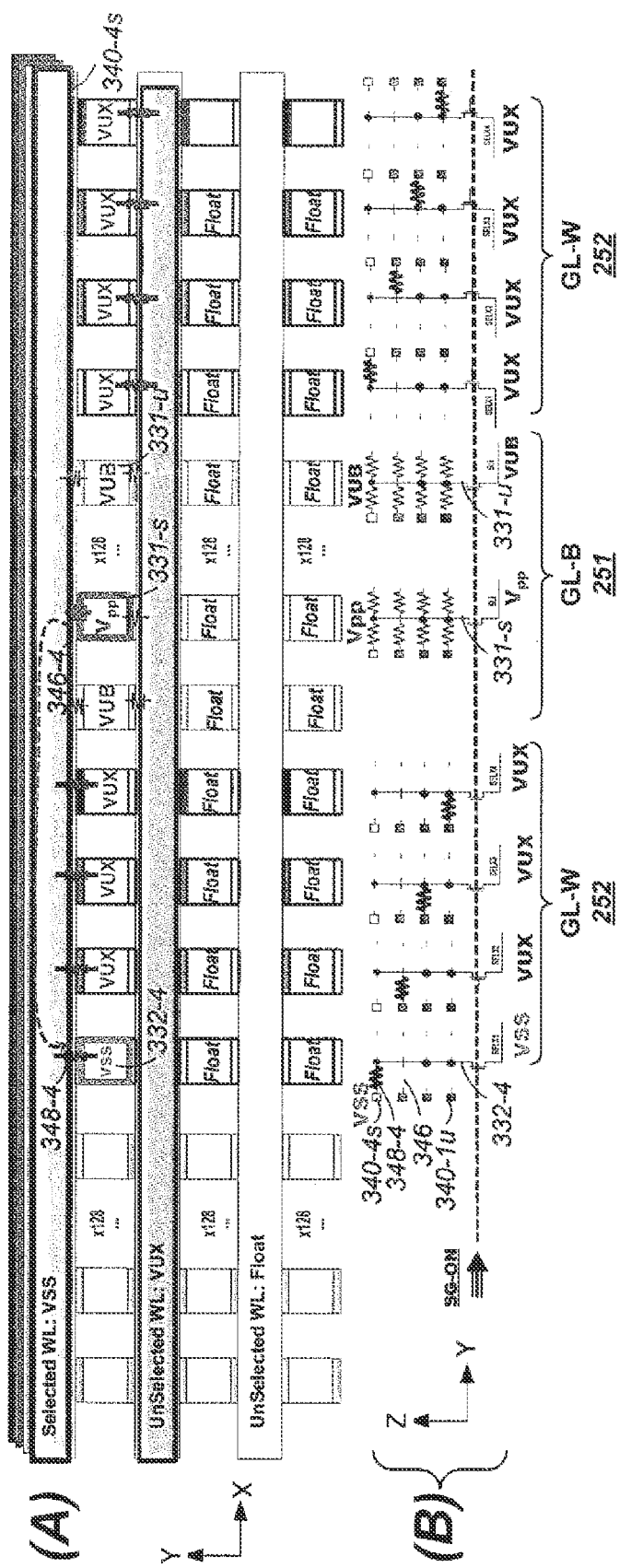
FIG. 14(A) is a plan view of the selected and unselected word lines and pillar lines and their bias voltages for the three-dimensional array of FIG. 12.
FIG. 14(B) is a sectional view of the three-dimensional array of FIG. 14(A)

FIG. 14(A) is a plan view of the selected and unselected word lines and pillar lines and their bias voltages for the three-dimensional array of FIG. 12. Coming out of factory, the first-type memory elements 346 are reset in a high resistance state and the second-type memory elements 346 are overset in a conductive state. Under user operations, the first-type memory elements 346, such as 346-4 can be set from a high resistance state to a low resistance state or reset from a low resistance state to a high resistance state. The reset can be accomplished by a forward-bias (voltage on the bit line is greater than that on the word line). For example, the selected first-type pillar line 331-s is at Vpp (e.g., 2V) and the selected word line 340-1s is at Vss (e.g., 0V). To prevent the unselected first-type memory elements 346 from being reset at the same time, the unselected first-type pillar lines such as 331-u are at VUB and the unselected word lines adjacent the selected first-type pillar line 331-s are at VUX. The voltages VUB and VUX are at ½Vpp (e.g., 1V).

More preferably, to reduce the quiescent currents in the unselected memory elements, the potential difference between the unselected bit lines and the unselected word lines is minimized. This can be accomplished by decreasing the unselected bit line voltage VUB from ½Vpp to as low as ⅓Vpp. Similarly, the unselected word line voltage VUX can be increased from ½Vpp to as high as ⅔Vpp.

FIG. 14(B) is a sectional view of the three-dimensional array of FIG. 14(A). The selected word line 340-4s is biased at Vss. This means the dedicated second-type pillar line 323-4 is also at Vss. Since all other unselected word lines 340-1u, 340-2 and 340-3 are all at VUX, there is not sufficient voltage difference to set the virgin memory elements attached to the dedicated second-type pillar line 323-4 from their high resistance state to a low resistance state. At other times, the word line 348-4 is unselected and therefore the dedicated second-type pillar line 323-4 is biased at VUX. Since the word lines that cross it are either selected at Vss or unselected at VUX, there is no chance that the unselected first-type memory elements 346 attached to the second-type pillar line 323-4 will get set from their virgin state.

Presetting the Second-Type Memory Elements to a Conductive State for Second-Type Pillar Lines to Connect to Respective Word Lines In one embodiment, the memory elements connected to the first-type and second-type pillars are the same, except the second-type memory elements 348 that act as conductors have been preset to a conductive state in an overset mode which subsequently cannot be reset to a less conductive state.

Figure 15:
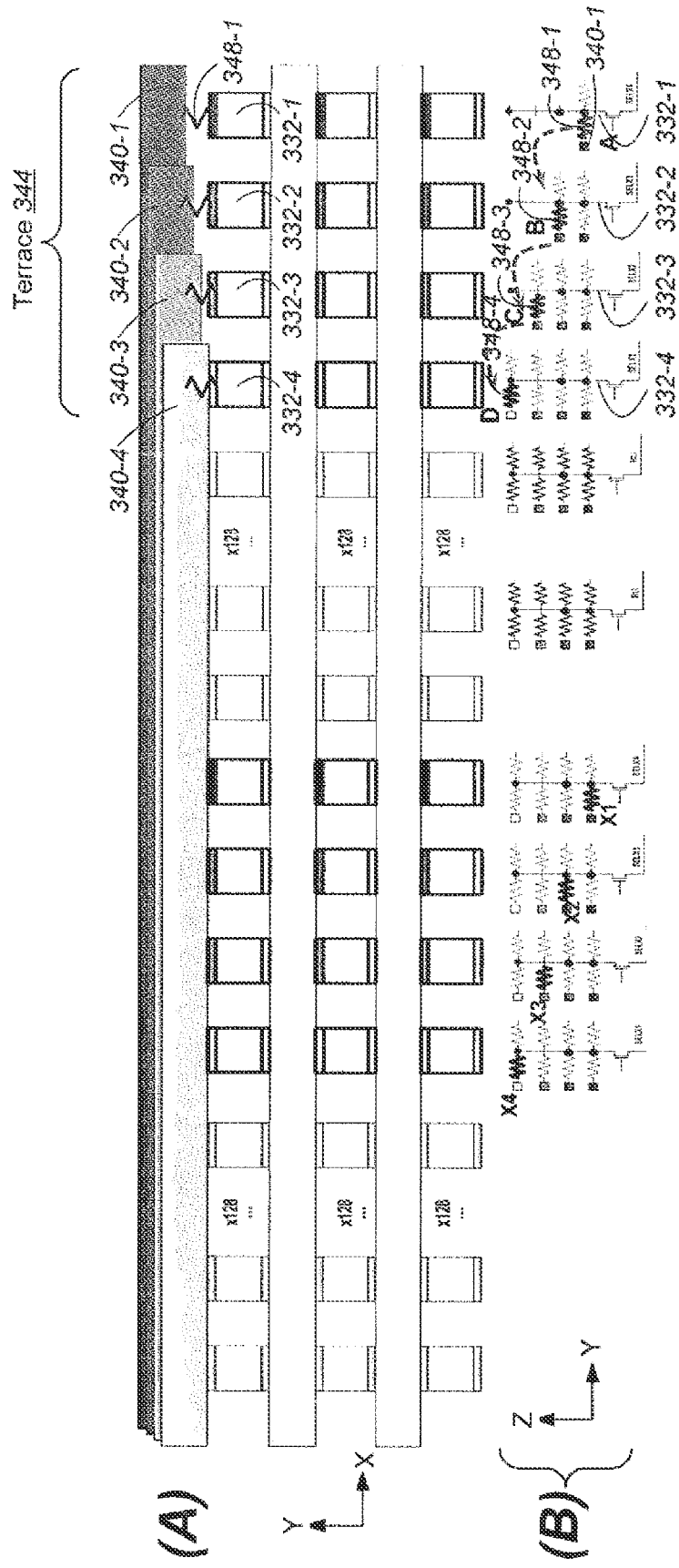
FIG. 15(A) is a plan view of the three-dimensional array of FIG. 12, illustrating a terrace structure of the memory layers at one end of the word lines.
FIG. 15(B) is a sectional view of the three-dimensional array of FIG. 15(A).

FIG. 15(A) is a plan view of the three-dimensional array of FIG. 12, illustrating a terrace structure of the memory layers at one end of the word lines. As described earlier, a word line 340 is accessed by a second-type global line 252 via a second-type pillar line 332. The second-type pillar line 332 is connected to the word line by presetting the interconnecting second-type memory element 348 to a conductive state. However, the presetting operation does not have the benefit of a connected word line yet.

FIG. 15(B) is a sectional view of the three-dimensional array of FIG. 15(A). A boot-strap operation on a memory having a terrace structure 344 at one end of the word lines allows the preset operation to be performed. In the example shown, there are four memory planes. Word lines 340-1, 340-2, 340-3 and 340-4 reside respective in the four memory planes from bottom to top. The four word line are to be connected to four respective second-type pillar lines 332-1, 332-2, 332-3 and 332-4 via respectively presetting the second-type memory elements 348-1, 348-2, 348-3 and 348-4. The memory is fabricated with the terrace 344 such that the second-type pillar line 332-1 only connects to the memory elements in the bottom plane 1. The elements in the planes above plane 1 are removed. The second-type pillar line 332-2 only connects to the memory elements in the bottom two planes 1 and 2. The second-type pillar line 332-3 only connects to the memory elements in the first three planes. Finally, the second-type pillar line 332-4 connects to the memory elements in all four planes.

The four word lines 340-1, 340-2, 340-3 and 340-4 are then connected to their respective second-type pillar lines 332-1, 332-2, 332-3 and 332-4 in the following sequence. First, the word line 340-1 is connected to the second-type pillar line 332-1 by presetting the second-type memory element 348-1 from a virgin, high resistance state to a conductive state. This is a set operation that would require the voltage on the word line 340-1 to be higher than that on the second-type pillar line 332-1. In practice, the voltage on the second-type pillar line 332-1 is at Vss (e.g., 0V) and the voltage on the word line 340-1 is sufficient high to reset the second-type memory element 348-1 to an over-set condition for the memory element to permanently remain in a highly conductive state. This is accomplished by applying a high voltage V_form (>Vpp, e.g., 3V) to all the rest of the pillar lines, which will capacitively couple the high voltage to the yet-to-be connected word line 340-1. In this way, the second-type memory element 348-1 is over-set to a highly conductive state thereby permanently connecting the word line 340-1 to the second-type pillar line 332-1.

Next, the word line 340-2 is connected to the second-type pillar line 332-2 by presetting the second-type memory element 348-2 from a virgin, high resistance state to a conductive state. The voltage on the second-type pillar line 332-2 is at Vss (e.g., 0V). The high voltage V_form (>Vpp, e.g., 3V) is applied to all the rest of the pillar lines, which will capacitively couple the high voltage to the yet-to-be connected word line 340-2. The now accessible word line 340-1 has is at the voltage VUX to prevent any changes there. In this way, the second-type memory element 348-2 is over-set to a highly conductive state thereby permanently connecting the word line 340-2 to the second-type pillar line 332-2.

Next, the word line 340-3 is connected to the second-type pillar line 332-3 by presetting the second-type memory element 348-3 from a virgin, high resistance state to a conductive state. The voltage on the second-type pillar line 332-3 is at Vss (e.g., 0V). The high voltage V_form (>Vpp, e.g., 3V) is applied to all the rest of the pillar lines, which will capacitively couple the high voltage to the yet-to-be connected word line 340-3. The now accessible word lines 340-1 and 340-2 are at the voltage VUX to prevent any changes there. In this way, the second-type memory element 348-3 is over-set to a highly conductive state thereby permanently connecting the word line 340-3 to the second-type pillar line 332-3.

Finally, the word line 340-4 is connected to the second-type pillar line 332-4 by presetting the second-type memory element 348-4 from a virgin, high resistance state to a conductive state. The voltage on the second-type pillar line 332-4 is at Vss (e.g., 0V). The high voltage V_form (>Vpp, e.g., 3V) is applied to all the rest of the pillar lines, which will capacitively couple the high voltage to the yet-to-be connected word line 340-4. The now accessible word lines 340-1, 340-2 and 340-3 are at the voltage VUX to prevent any changes there. In this way, the second-type memory element 348-4 is over-set to a highly conductive state thereby permanently connecting the word line 340-4 to the second-type pillar line 332-3. In this manner all word lines in all memory planes can be connected to their respective second-type pillar lines.

While a terrace structure for the layers of word lines provides a way to properly bias each word line for the presetting operation, other embodiments are possible. For example, a hybrid approach will have each word line connected to a zia and a word line driver on the substrate as in the conventional case. This will certainly provide access to the word line from the very beginning. The word lines are each long so that a minimum of access is needed so that the overheads from the zias and word line drivers will be at a minimum. The resistance to the long word line can be controlled by providing the cell-selected word line access using a number of the second-type pillar lines along the length of the word line.

In another embodiment, the second-type memory elements are constituted from a one-time programmable material that includes SiOx.

In yet another embodiment, a word line associated with a row of pillar lines is accessed in parallel at multiple locations by multiple second-type pillars in order to control the word line resistance along its length.

In yet another embodiment, a plurality of select devices is employed to switch the pillar lines row by row to the array of metal lines. The select devices are formed in a semiconductor switching layer above the semiconductor substrate and the multiple layers of planes are formed as a stack over the semiconductor switching layer.

This provides a highly scalable architecture for decoding bit lines and word lines. For example, one of the causes of leakage in the resistive mesh is due to finite resistance across the length of individual word lines. The word lines can be segmented to reduce their resistance. The segmented word lines can be readily accessed by appropriating more of the pillar lines and metal lines to the increased number of segments. The memory elements are uniform and the pillar lines are also uniform, which result in a highly repeated pattern that is simple to process.

It is claimed:

1. A memory including memory elements arranged in a three-dimensional pattern defined by rectangular coordinates having x, y and z-directions and with a plurality of parallel planes stacked in the z-direction, the memory further comprising:
   a plurality of first conductive lines elongated in the z-direction through the plurality of planes and arranged in a two-dimensional rectangular array of rows in the x-direction and columns in the y-direction, wherein said plurality of first conductive lines is constituted from first-type first conductive lines and second-type first conductive lines;
   a plurality of second conductive lines elongated in the x-direction across individual planes and spaced apart in the y-direction between and separated from the plurality of first conductive lines in the individual planes, wherein the first and second conductive lines cross adjacent each other at a plurality of locations across the individual planes;
   a plurality of non-volatile memory elements connected between respective first conductive lines and second conductive lines adjacent the crossings thereof at the plurality of locations, wherein said plurality of non-volatile memory elements is constituted from first-type memory elements and second-type memory elements;
   each said second conductive line is for exclusive access to a second-type first conductive line via a second-type memory element acting as a conducting connector with said second-type memory element preset in a permanently conductive state;
   a plurality of third conductive lines; and
   a row of select devices arranged to switch a respective selected row of first conductive lines respectively to the plurality of third conductive lines.

2. The memory as in claim 1, wherein:
said first-type memory elements each has a resistance that reversibly shift in resistance in response to an applied voltage or a passing current.

3. The memory as in claim 1, wherein:
said second-type memory elements each has a resistance that reversibly shift in resistance in response to an applied voltage or a passing current but are preset into the conductive state in an overset mode which cannot be reset to a less conductive state.

4. The memory as in claim 1, wherein:
said first-type and second type memory elements are re-programmable.

5. The memory as in claim 1, wherein:
said second-type memory elements are constituted from an one-time programmable material that includes SiOx.

6. The memory as in claim 1, wherein:
a second-type first conductive lines along the row is exclusively connected to the selected second conductive line by one of said second-type memory elements.

7. The memory as in claim 1, wherein:
a plurality of second-type first conductive lines at different locations along the row are each exclusively connected to the selected second conductive line by one of said second-type memory elements.

8. The memory of claim 1, wherein:
the third conductive lines are elongated in the y-direction, the select devices are arranged to make those of the first conductive lines aligned in the x-direction connectable with selected ones of the plurality of third conductive lines, and
a plurality of control lines extending in the x-direction and individually connected with a plurality of the select devices aligned in the x-direction to enable connection of a plurality of first conductive lines aligned in the x-direction with different ones of the third conductive lines.

9. The memory as in claim 1, wherein:
the plurality of select devices are formed in a semiconductor switching layer above the semiconductor substrate and the plurality of planes are formed as a stack over the semiconductor switching layer.

10. The memory as in claim 1, wherein:
said plurality of third conductive lines are metal lines below the select devices.

11. A method of operating a re-programmable non-volatile memory system, comprising:
utilizing at least one integrated circuit that includes a three-dimensional pattern of memory elements defined by rectangular coordinates having x, y and z-directions and which comprises:
   a plurality of first conductive lines elongated in the z-direction through the plurality of planes and arranged in a two-dimensional rectangular array of rows in the x-direction and columns in the y-direction, wherein said plurality of first conductive lines is constituted from first-type first conductive lines and second-type first conductive lines;
   a plurality of second conductive lines elongated in the x-direction across individual planes and spaced apart in the y-direction between and separated from the plurality of first conductive lines in the individual planes, wherein the first and second conductive lines cross adjacent each other at a plurality of locations across the individual planes;
   a plurality of non-volatile memory elements connected between respective first conductive lines and second conductive lines adjacent the crossings thereof at the plurality of locations, wherein said plurality of non-volatile memory elements is constituted from first-type memory elements and second-type memory elements;
   each said second conductive line is for exclusive access to a second-type first conductive line via a second-type memory element acting as a conducting connector with said second-type memory element preset in a permanently conductive state;
   a plurality of third conductive lines; and
   a row of select devices arranged to switch a respective selected row of first conductive lines respectively to the plurality of third conductive lines.

12. The method as in claim 11, wherein:
said first-type memory elements each has a resistance that reversibly shift in resistance in response to an applied voltage or a passing current.

13. The method as in claim 11, wherein:
said second-memory elements each has a resistance that reversibly shift in resistance in response to an applied voltage or a passing current but are preset into the conductive state in an overset mode which cannot be reset to a less conductive state.

14. The method as in claim 11, wherein:
said first-type memory elements are re-programmable.

15. The method as in claim 11, wherein:
said second-type memory elements are constituted from a one-time programmable material that includes SiOx.

16. The method as in claim 11, wherein:
a second-type first conductive lines along the row is exclusively connected to the selected second conductive line by one of said second-type memory elements.

17. The method as in claim 11, wherein:
a plurality of second-type first conductive lines at different locations along the row are each exclusively connected to the selected second conductive line by one of said second-type memory elements.

18. The method as in claim 11, wherein:
the third conductive lines are elongated in the y-direction, the select devices are arranged to make those of the first conductive lines aligned in the x-direction connectable with selected ones of the plurality of third conductive lines, and
a plurality of control lines extending in the x-direction and individually connected with a plurality of the select devices aligned in the x-direction to enable connection of a plurality of first conductive lines aligned in the x-direction with different ones of the third conductive lines.

19. The method as in claim 11, wherein:
the plurality of select devices are formed in a semiconductor switching layer above the semiconductor substrate and the plurality of planes are formed as a stack over the semiconductor switching layer.

20. The method as in claim 11, wherein:
said plurality of third conductive lines are metal lines below the select devices.

* * * * *